United States Patent
Yi et al.

(10) Patent No.: US 8,331,129 B2
(45) Date of Patent: Dec. 11, 2012

(54) MEMORY ARRAY WITH WRITE FEEDBACK

(75) Inventors: Wei Yi, Mountain View, CA (US);
Frederick Perner, Santa Barbara, CA (US); Matthew D. Pickett, San Francisco, CA (US); Muhammad Shakeel Qureshi, Santa Clara, CA (US)

(73) Assignee: Hewlett-Packard Development Company, L. P., Houston, TX (US)

( * ) Notice: Subject to any disclaimer, the term of this patent is extended or adjusted under 35 U.S.C. 154(b) by 231 days.

(21) Appl. No.: 12/875,423

(22) Filed: Sep. 3, 2010

(65) Prior Publication Data
US 2012/0057390 A1 Mar. 8, 2012

(51) Int. Cl.
*G11C 11/00* (2006.01)
(52) U.S. Cl. .................................. 365/148; 365/158
(58) Field of Classification Search ............... 365/148, 365/158, 163
See application file for complete search history.

(56) References Cited

U.S. PATENT DOCUMENTS

| | | | |
|---|---|---|---|
| 5,579,262 A * | 11/1996 | Song | 365/185.22 |
| 2008/0080232 A1* | 4/2008 | Sturm et al. | 365/158 |
| 2008/0219049 A1* | 9/2008 | Banks | 365/185.03 |
| 2010/0202185 A1* | 8/2010 | Katoh et al. | 365/148 |

* cited by examiner

*Primary Examiner* — Vu Le (57) ABSTRACT

A memory array with write feedback includes a number of row lines intersecting a number of column lines, a memory element connected between one of the row lines and one of the column lines, an electrical condition supply to be selectively applied to one of the row lines; and a feedback control loop to control an electrical condition supplied by the electrical condition supply. A method for setting the state of a memory element within a memory array includes applying an electrical condition to the memory element within the memory array, sensing a resistive state of the memory element, and controlling the electrical condition based on the sensed resistive state to cause the memory element to reach a target resistance.

15 Claims, 6 Drawing Sheets

MEMORY ARRAY WITH WRITE FEEDBACK

STATEMENT OF GOVERNMENT INTEREST

This invention has been made with government support under Contract No. HR0011-09-3-0001, awarded by the Defense Advanced Research Project Agency. The government has certain rights in the invention.

BACKGROUND

As the use of digital data increases, the demand for faster, smaller, and more efficient memory structures increases. One type of memory structure that has recently been developed is a crossbar memory array. A crossbar memory array includes a first set of conductive lines which intersect a second set of parallel conductive lines. Programmable memory elements configured to store digital data are placed at intersections between the first set of lines and second set of lines.

One type of memory element which can be used is a memristive memory element. A memristive memory element can change the state of its resistance in response to an applied electrical condition such as a voltage or an electric current. The resistive state of a memristive memory element can be used to store digital data. For example, a high resistance state can represent a digital '0' and a low resistance state can represent a digital '1'.

The electrical conditions used to set the state of a memristive memory element are typically applied in an open loop configuration. This means that the circuitry applying the electrical conditions is not made aware of the resistive state of the memristive devices being set. This leads to a variation in resistance levels between memristive memory elements in a particular state. It can also lead to a variation in resistance levels of one memory element in a particular state after each set. For example, all of the memristive memory elements in a memory array that are set to a high resistive state may have varying resistance levels. Additionally, all of the memristive memory elements in the array set to a low resistive state may have varying resistance levels. Furthermore, a selected memory element set to a high resistance level may have varying resistance levels after each write operation. This can cause issues with the performance of the memory array including, but not limited to, increased error rate in memory reading, and reduced upper limit of write cycles.

BRIEF DESCRIPTION OF THE DRAWINGS

The accompanying drawings illustrate various embodiments of the principles described herein and are a part of the specification. The illustrated embodiments are merely examples and do not limit the scope of the claims.

Throughout the drawings, identical reference numbers designate similar, but not necessarily identical, elements.

DETAILED DESCRIPTION

As mentioned above, the electrical conditions used to set the state of a memristive memory element are typically applied in an open loop configuration. This means that the circuitry applying the electrical conditions is not made aware of the resistive state of the memristive devices being set. This leads to a variation in resistance levels between memristive memory elements in a particular state. For example, all of the memristive memory elements in the array set to a high resistive state may have varying resistance levels. Additionally, all of the memristive memory elements in the array set to a low resistive state may have varying resistance levels. This can cause issues with the performance of the memory array.

In light of this and other issues, the present specification discloses a memory array with writing circuitry that includes a closed feedback loop. The feedback loop allows the writing circuitry to be aware of the resistive state of a memory element as that memory element is being written. This allows the writing circuitry to control the electrical condition being applied so that the memory element reaches a specific resistance level.

For example, the writing circuitry can apply a programming voltage or an electric current to the memory element. At a particular voltage level or current level, the longer the voltage or current pulse is applied, the more the resistance level of the memory element will change. When the memory element reaches a specific resistance level, the feedback loop signals the writing circuitry to discontinue the application of the voltage or current to the memory element.

Through use of systems and methods embodying principles described herein, a finer control over the resistive state of memory elements within an array can be realized. This finer control can reduce the variability between memory elements in a particular state. Additionally, the finer control can allow multiple bits to be stored in a single memristive memory element. This allows a multi-level cell memory array to be implemented.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
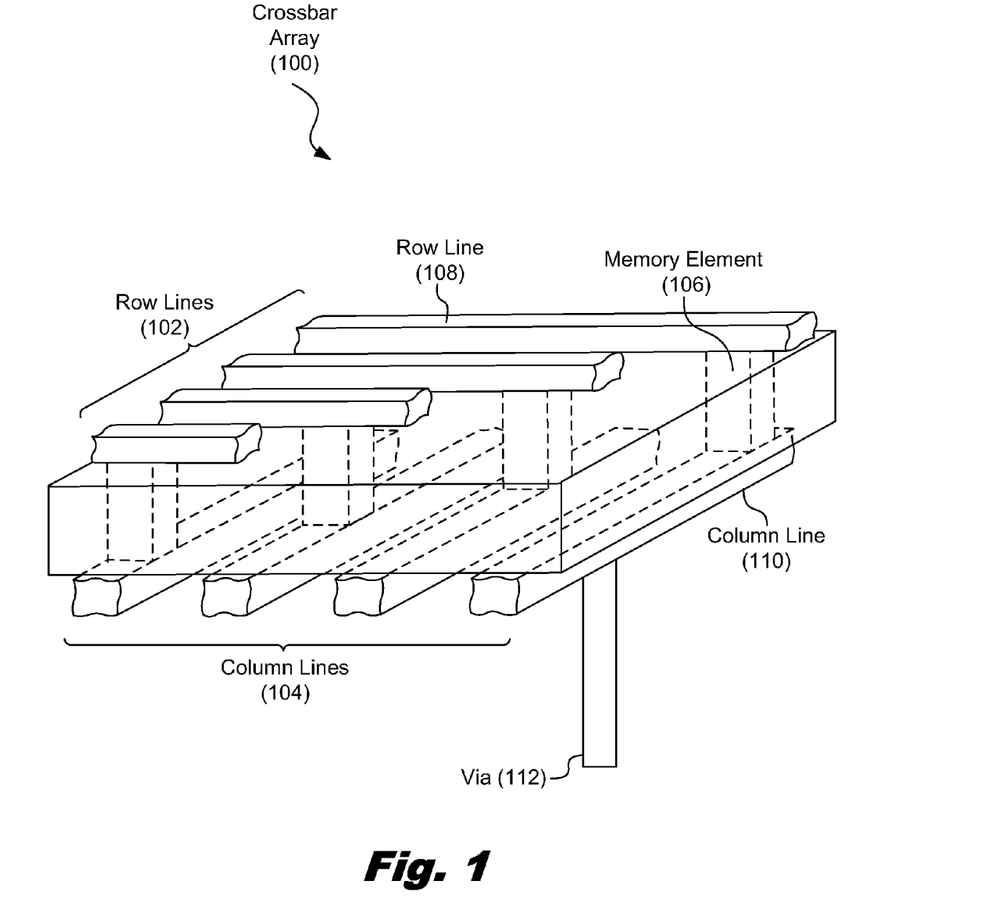
FIG. 1 is a diagram showing an illustrative crossbar memory array, according to one example of principles described herein.

Referring now to the figures, FIG. 1 is a diagram showing an illustrative crossbar memory array (100). According to certain illustrative examples, the crossbar array (100) includes a set of conductive row lines (102) which are generally in parallel. Additionally, a set of conductive column lines (104) is generally perpendicular to, and intersects, the row lines (102). Programmable memory elements (106) are disposed at the intersections between a row line (108) and a column line (110). The terms "row line" and "column line"

are not used to indicate a specific position or orientation. Rather, the terms are used to distinguish position or orientation relative to one another.

According to certain illustrative examples, the programmable memory elements (106) may be memristive devices. Memristive devices exhibit a "memory" of past electrical stimuli. For example, a memristive device may include a memristive matrix material that contains mobile dopants. These dopants can be moved within the memristive matrix to dynamically alter the electrical operation of the memristive device. More detail on the properties of memristive devices will be described below.

According to certain illustrative examples, the crossbar array (100) may be used to form a non-volatile memory array. Each of the programmable memory elements (106) is used to represent one or more bits of data. Although individual row lines (108) and column lines (110) in FIG. 1 are shown with rectangular cross sections, crossbars may also have square, circular, elliptical, or more complex cross sections. The lines may also have many different widths, diameters, aspect ratios and/or eccentricities. The crossbars may be nanowires, sub-microscale wires, microscale wires, or wires with larger dimensions.

According to certain illustrative examples, the crossbar architecture (100) may be integrated into a Complimentary Metal-Oxide-Semiconductor (CMOS) circuit or other conventional computer circuitry. Each individual line may be connected to the CMOS circuitry by a via (112). The via (112) may be embodied as an electrically conductive path through the various substrate materials used in manufacturing the crossbar architecture. This CMOS circuitry can provide additional functionality to the memristive device such as input/output functions, buffering, logic, configuration, or other functionality. Multiple crossbar arrays can be formed over the CMOS circuitry to create a multilayer circuit.

Figure 2A:
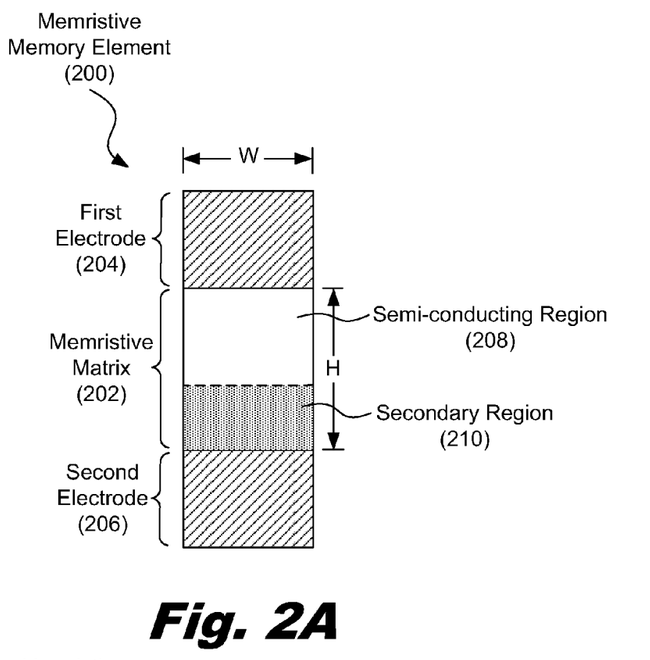
FIGS. 2A and 2B are diagrams showing an illustrative memristive memory element, according to one example of principles described herein.

FIG. 2A is diagram showing an illustrative memristive device with no electrical conditions being applied. According to one illustrative example, the memristive device includes a first electrode (204) and a second electrode (206) in electrical and physical contact with a memristive matrix (202). The memristive matrix (202) is initially comprised of two separate regions: a semiconducting region (208) which is not intentionally doped and a highly doped secondary region (210).

Throughout this specification, the term "memristive matrix" describes a thin film of material that is electronically semiconducting or nominally electronically insulating and also a weakly ionic conductor. The memristive matrix is capable of transporting and hosting ions that act as dopants to control the flow of electrons through the memristive device (200). The basic mode of operation is to apply an electrical field (the drift field, which may exceed a threshold for enabling the motion of the ions in the memristive matrix) across the memristive device. The electrical field is large enough to cause an ionic species to be transported within the memristive matrix via ionic transport. The ionic species are specifically chosen from those that act as electrical dopants for the memristive matrix, and thereby change the electrical conductivity of the matrix from a high resistive state to a low resistive state. Furthermore, the memristive matrix and the dopant species are chosen such that the drift of the dopants within the memristive matrix is possible but not too facile. This ensures that the memristive device remains in whatever state it is set for a reasonably long time, perhaps many years at room temperature. Thus, the memristive device (200) is nonvolatile. A nonvolatile device is one which holds its state with or without receiving power.

The matrix material (202) may be a thin film (generally less than 200 nm thick), and is in many cases nanocrystalline or amorphous. The mobility of the dopant species in such nanostructured materials is much higher than in a bulk crystalline material, since diffusion can occur through grain boundaries, pores, or through local structural imperfections in an amorphous material. Also, because the film is so thin, the amount of time required to drift enough dopants into or out of a local region of the film to substantially change its conductivity is relatively rapid. Another advantage of nanometer scale memristive devices is that a large electrical field can be produced by a relatively small applied voltage.

Conduction of electrons through the matrix material (202) is frequently dominated by quantum mechanical tunneling of the electrons. When a semiconducting matrix material is essentially intrinsic at a junction with an electrode, the tunneling barrier is high and wide, causing the memristive device to be in a high resistive state. When a significant number of dopant species have been injected into or distributed throughout the semiconductor, the width and perhaps the height of the tunneling barrier are diminished by the potential of the charged species. This results in an increase of the conductivity of the switch, placing the memristive device (200) in a low resistive state.

FIG. 2A illustrates one potential "as manufactured" state of the memristive device (200). The semiconducting region (208) has very few dopants and prevents electrical current from flowing between the two electrodes (204, 206). The secondary region (210) is conductive and serves as a source of dopants which can be moved into the semiconducting region (208) to change the overall electrical conductivity of the memristive matrix (202). Consequently, in the "as manufactured" state of the memristive device illustrated in FIG. 2A, the memristive device (200) is a high resistive state.

The electrodes (204, 206) may be constructed from a variety of conducting materials, including but not limited to: metals, metal alloys, metal composite materials, nanostructured metal materials, or other suitable conducting materials.

The memristive matrix (202) has a height of "H" and a width of "W" as shown in FIG. 2A. For purposes of illustration only, assume that the height "H" is 100 nanometers and the width "W" is approximately 50 nanometers. As discussed above, a relatively intense electrical field can be generated across the thin film of memristive matrix by a relatively small voltage. For example, a dopant may require an electrical field intensity of 100,000 volts per centimeter to move within the matrix. If the distance between two electrodes is 100 nanometers, a voltage bias of only 1 Volt applied across the first electrode (204) and the second electrode (206) will produce the required electrical field intensity of 100,000 volts/centimeter through the memristive material (202). The application of a programming voltage above a certain threshold allows the dopants to be moved through the memristive matrix (202).

Figure 2B:
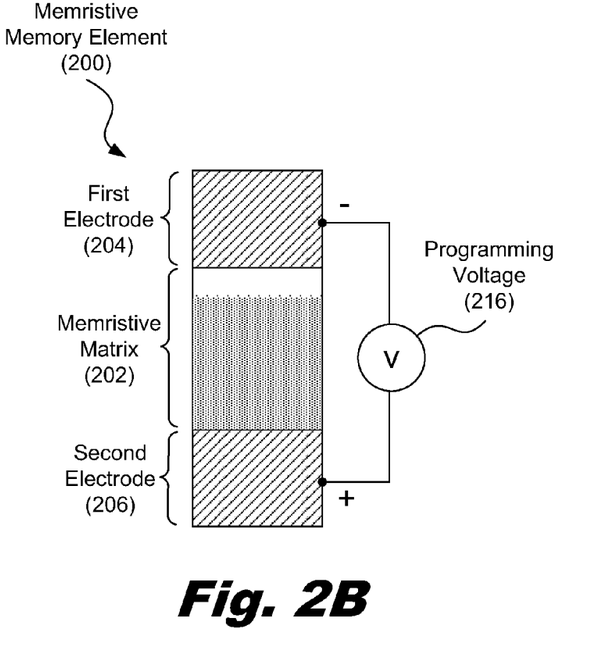

FIG. 2B is a diagram showing the memristive device (200) with a programming voltage (216) applied. The programming voltage (216) results in an electrical field which facilitates not only the movement of dopants from the highly doped region (210) into the intrinsic region (208) but also the creation of some native dopants, such as oxygen vacancies, via an electro-reduction process in oxide memristive materials. The polarity and voltage difference which is applied across the memristive matrix (202) varies according to a variety of factors including, but not limited to: material properties, geometry, dopant species, temperature, and other factors. For example, when the ions are positively charged, the ions are repelled by positive voltage potentials and attracted to negative voltage potentials. For example, a positive voltage may be applied to the second electrode (206) and negative voltage may be applied to the first electrode (204).

According to one illustrative example, the initial application of a programming voltage (216) to the memristive device (200) is used to form the junction and define its characteristics. This initial programming voltage (216) may be higher than other applied voltages used for operational purposes. The initial programming voltage (216) may serve a number of functions which prepare the junction for further use. For example, the programming voltage (216) may result in the initial creation of additional mobile dopants or the migration of the mobile dopants into more active regions of the memristive matrix (202), which reduces the effective thickness of the switching layer and causes an increased electric field with the same applied voltage. In addition, the electric field for dopant drift in the switching process is usually lower than that for dopant creation in the electroforming process. Consequently, lower programming voltages (216) can be subsequently used to move the dopants the memristive matrix has been fabricated.

In some cases, application of an electric current rather than a voltage may be better suited towards altering the resistive state of a memristive device. The resistive state of a memristive device is dominated by the highly resistive semiconducting region (the tunnel gap). The final tunnel gap thickness after switching occurs can be a more sensitive function of the amount of current that flows through the device during switching event, rather than a function of the applied voltage (field strength) that initiates the dopant drift.

Figure 3:
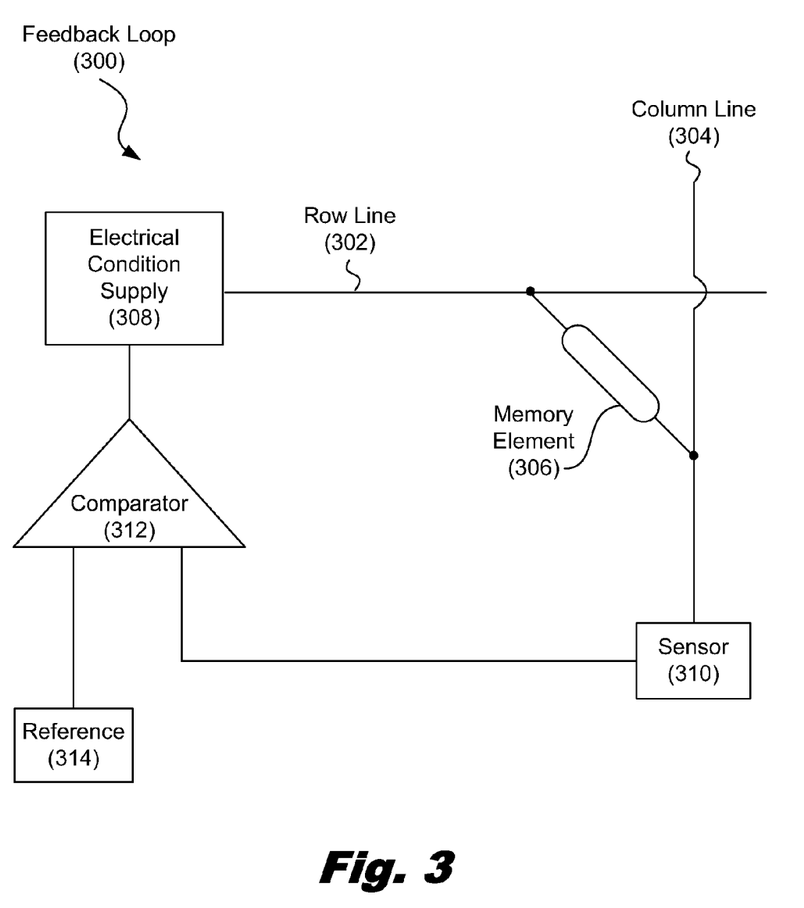
FIG. 3 is a diagram showing an illustrative feedback loop, according to one example of principles described herein.

FIG. 3 is a diagram showing an illustrative feedback loop (300). According to certain illustrative examples, the feedback loop (300) includes an electrical condition supply (308) to apply an electrical condition to a memory element (306). The feedback loop (300) controls the electrical condition supply so that the driver properly applies an electrical condition to cause the memory element (306) to reach a specific resistance level. This resistance level will be referred to as the target resistance.

Feedback loops are often used to provide information relative to the output of a system to the input of a system. A memory system embodying principles described herein may utilize a variety of feedback loop structures to cause a memory element to reach a target resistance. One such feedback loop structure will now be described.

The electrical condition supply (308) is a component which outputs an electrical condition such as an electric current or a voltage. The electrical condition supply can output voltage or current pulses. These pulses may be of a variety of shapes including, but not limited to, square pulses, triangular pulses, and arbitrary linear and nonlinear waveforms.

The electrical condition supply (308) can output either a voltage pulse or a current pulse. To apply a voltage or current pulse to a memory element (306), the electrical condition supply (308) can be selectively connected to a row line (302) within a memory array. Methods used to select a particular memory element along that row line (302) and prevent the voltage from adversely affecting the unselected memory elements within the memory array is beyond the scope of this specification. Thus, a detailed description of such methods will not be given here.

A sensor (310) is connected to the column line (304) connected to the memory element (306). The sensor (310) may be one of a variety of electrical components. For example, the sensor (310) may be a sense amplifier to sense the electric current flowing from the memory element (306). Because the current flowing from the memory element (306) is dependent upon the resistive state of the memory element, the sensor (310) can produce an output voltage signal that is directly related to the resistive state of the memory element (306). This output voltage signal is then fed to one input of a comparator (312).

A comparator (312) is an electronic circuit that makes a comparison between two input signals and outputs a signal based on that comparison. The output signal of a comparator typically outputs either a logic high signal or a low signal. For example, if the first input of the comparator has a higher signal than the second input, then the output will be a high signal. If the first input of the comparator has a lower signal than the second input, the comparator will output a low signal. There is typically a time delay between the instant that one signal surpasses the other and the instant that the output of the comparator changes. When used in a feedback loop, this time delay property of the comparator (312) should be made small enough to ensure effective operation of the feedback loop (300).

In the example illustrated in FIG. 3, the first input of the comparator (312) is connected to a reference signal (314). The second input of the comparator (312) is connected to the output of the sensor (310). If the signal from the sensor (310) is lower than the reference signal (314), then the comparator will output a low signal. When the output from the sensor (310) goes higher than the reference signal (314), then the comparator (312) will output a high signal. The value of the reference signal (314) may vary depending on the target resistance for the memory element (306). The reference signal (314) can be chosen such that when the memory element (306) reaches the target resistance, the value of the output signal from the sensor (310) will surpass the value of the reference signal (314). This will cause the comparator (312) to switch from outputting a low signal to outputting a high signal.

The electrical condition supply (308) can be set to start applying a voltage to the memory element (306) at a given time. The electrical condition supply (308) will then continue to apply this voltage until the signal received from the comparator (312) changes. Because the signal from the comparator (312) will change when the memory element (306) reaches its target resistance value, the application of the voltage will be discontinued at the proper time to cause the memory element (306) to reach that target resistance.

Figure 4:
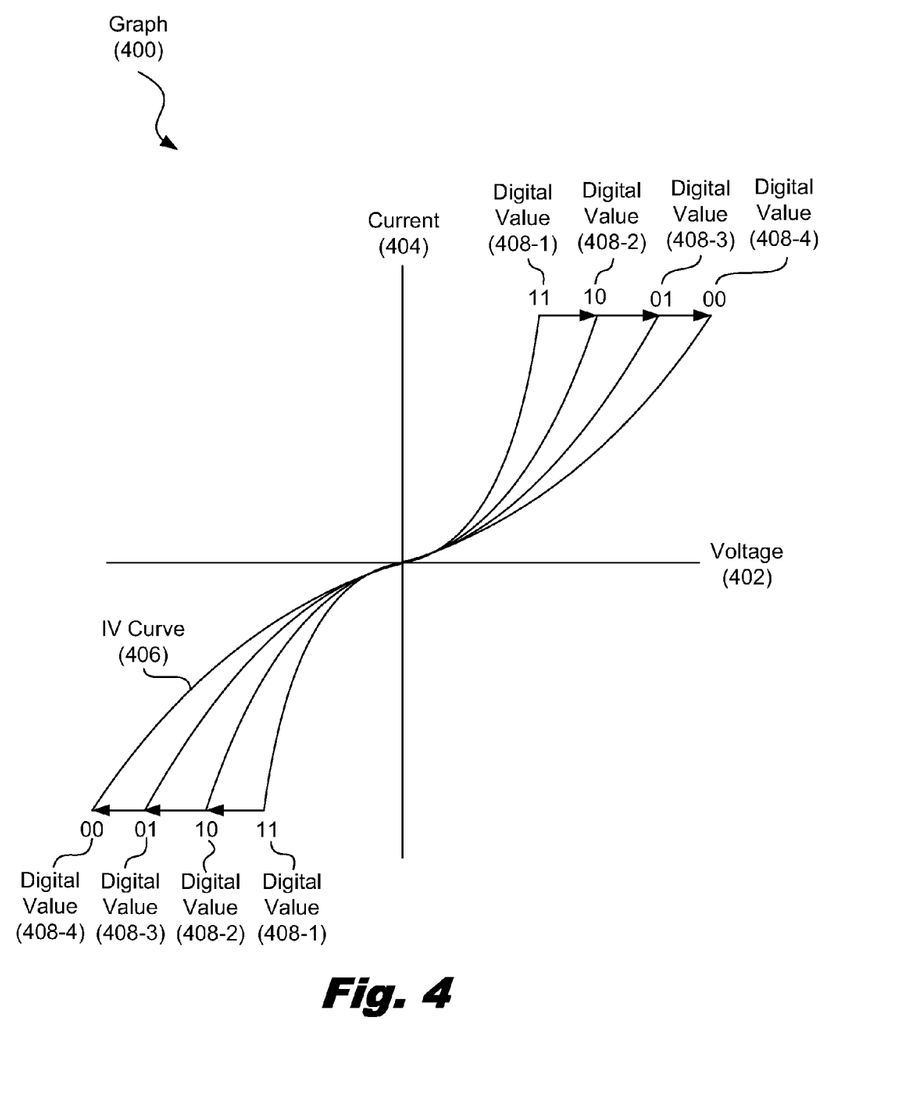
FIG. 4 is a diagram showing an illustrative graph showing the current to voltage relationships of a memristive device, according to one example of principles described herein.

FIG. 4 is a diagram showing an illustrative graph (400) showing the current to voltage relationships of a memristive device. The horizontal axis of the graph represents voltage (402) and the vertical axis of the graph represents electric current (404). The graph shows four different current to voltage curves (406). Each curve indicates one state of a memristive memory element (e.g. 200, FIG. 2).

According to one illustrative example, the memristive memory element may be set to four different states. This allows the memory element to store two bits of data. The curve (406) representing the digital value "11" (408-1) represents the highest resistive state and the curve (406) representing the digital value "00" (408-4) indicates a low resistive state. A programming voltage or current can then be applied using the feedback loop as described above to change the resistance of the memory element a precise amount. For example, the programming voltage may be applied long enough to decrease the resistance of the memory device and move IV curve (406) to represent the digital value "10" (408-2). The voltage or current may be further applied to further decrease the resistance of the memory element and cause the IV curve (406) to represent the digital value "01" (408-3). A programming voltage or current of opposite polarity will increase the resistance of the memory element and move the IV curve (406) in the opposite direction.

Figure 5:
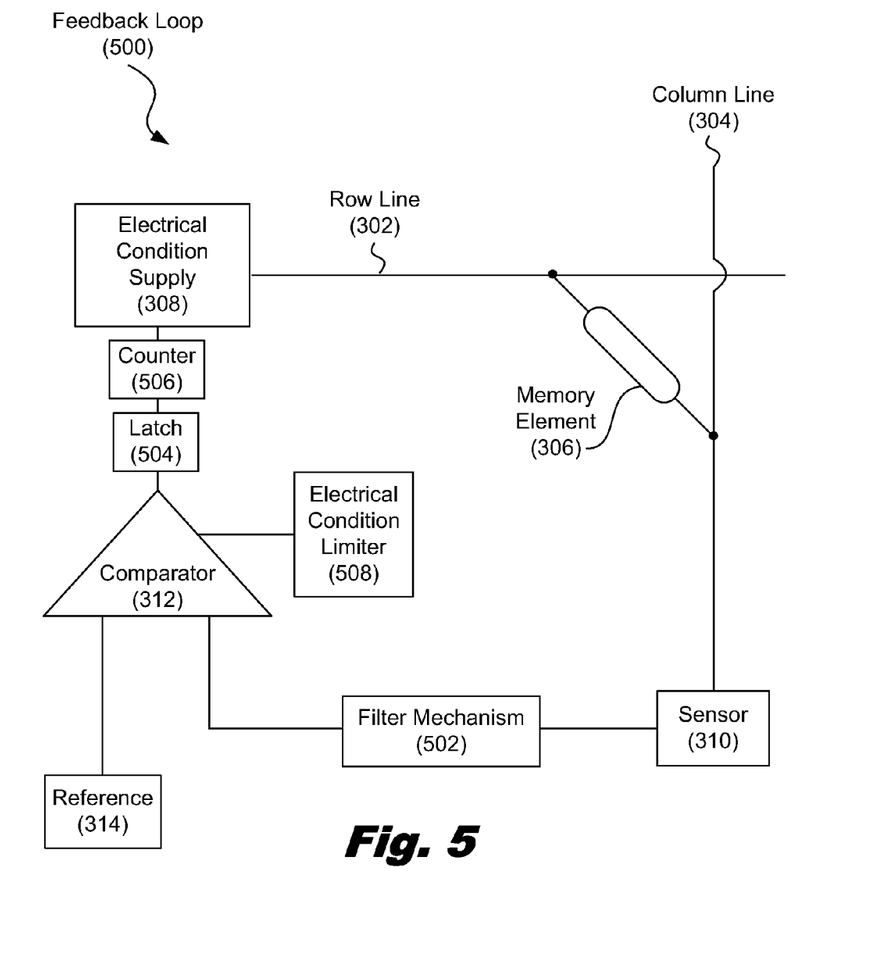
FIG. 5 is a diagram showing an illustrative feedback loop with additional components, according to one example of principles described herein.

FIG. 5 is a diagram showing an illustrative feedback loop (500) with additional components. According to certain illustrative examples, the feedback loop may include additional components to provide additional functionality to the writing circuitry. These additional components may include a filter mechanism (502), a latch (504), a counter (506), and an electrical condition limiter (508).

According to one illustrative example, a feedback loop (500) may include a filter mechanism (502) between the sensor (310) and the input to the comparator (312). The filter mechanism filters the signal sent from the sensor (310) to the comparator by reducing transients and spikes in the signal. This is beneficial because transients or spikes could trip the comparator before the memory element (306) reaches the target resistance. One example of a filter mechanism (502) which could be used is a sample and hold circuit.

According to one illustrative example, the feedback loop (500) may include a latch mechanism (504). The latch mechanism (504) maintains a logic high signal after the comparator is triggered to output the logic high signal. The latch will maintain that logic high signal sent from the comparator output even if the comparator output changes back to a logic low signal level. The latch output can be reset to a logic low signal by a reset signal. This reset signal can be received by the latch mechanism (504) before a subsequent write operation. The latch mechanism (504) can prevent the feedback loop from running into oscillation due to possible sign reversal of the comparator differential input after the current or voltage pulse is stopped.

According to one illustrative example, the feedback loop (500) may include a counter (504). The counter (504) can record data such as how long it typically takes for a memory element to reach a target resistance in response to the applied electrical condition. This information may be valuable when determining at what speed the memory array should be clocked. The data collected by the counter (504) may be used for a variety of debugging and logging purposes.

According to one illustrative example, the feedback loop (500) may include an electrical condition limiter (506). The electrical condition limiter (506) is a device that stops the electrical condition supply (308) from continuing to apply an electrical condition. This may be beneficial in the case that the memory element (306) is defective or worn out. If the memory element (306) is defective or worn out, then it may never reach the target resistance no matter how long an electrical condition is applied. The electrical condition limiter (506) prevents the system from becoming locked up waiting for the comparator (312) to trip. In one example, the limiter can trip the comparator (312) after a specified amount of time even if the signal from the sensor (310) does not surpass the reference signal (314). Alternatively, the limiter can send a signal directly to the electrical condition supply (308) to cause application of the electrical condition to stop.

Figure 6:
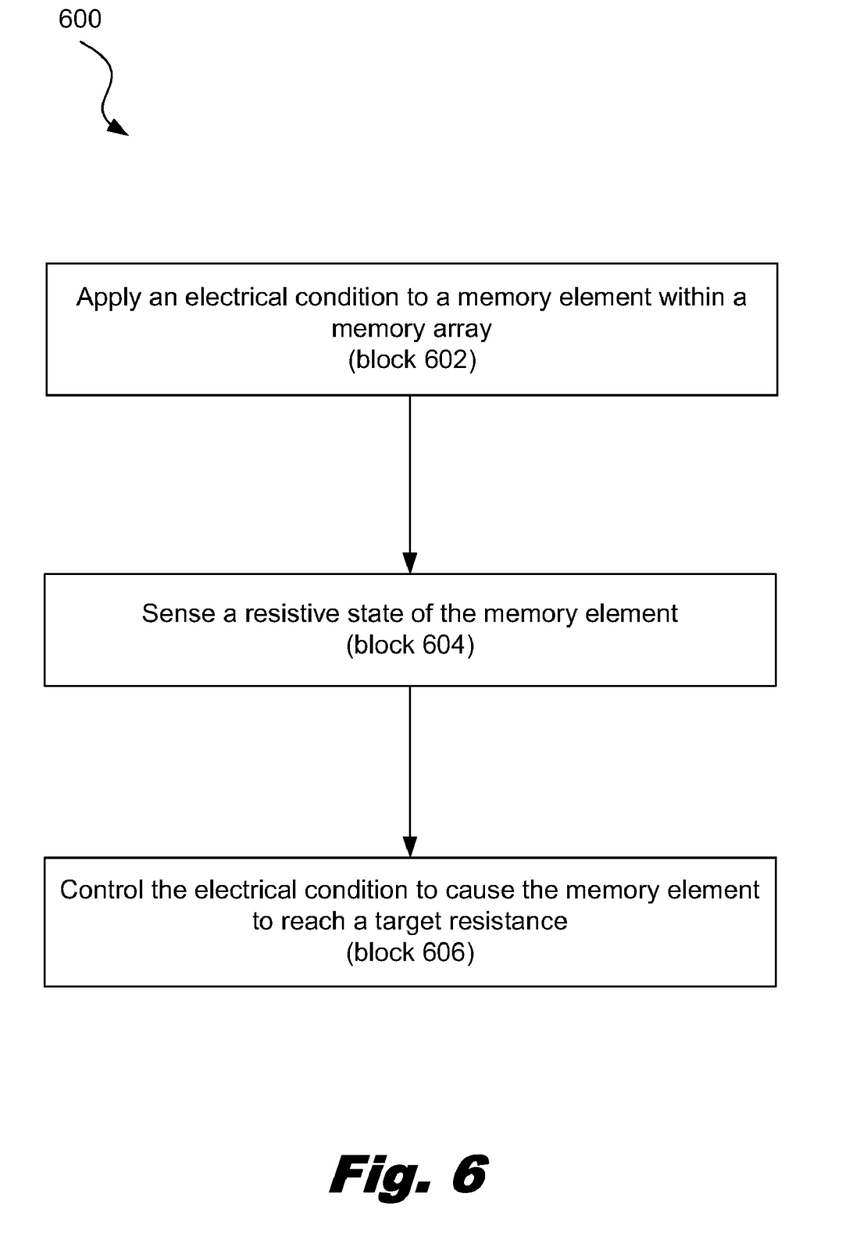
FIG. 6 is a flowchart showing an illustrative method for setting the state of a memristive device, according to one example of principles described herein.

FIG. 6 is a flowchart showing an illustrative method for setting the state of a memristive device. According to certain illustrative examples, the method includes applying (block 602) an electrical condition to a memory element within a memory array, sensing (block 604) a resistive state of the memory element, and controlling (block 606) the electrical condition to cause the memory element to reach a target resistance.

In conclusion, through use of system and methods embodying principles described herein, a finer control over the resistive state of memory elements within an array can be realized. This finer control can reduce the variability between memory elements in a particular state. Additionally, the finer control can allow multiple bits to be stored in a single memristive memory element.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memory array with write feedback, the memory array comprising:
   a number of row lines intersecting a number of column lines;
   a memory element connected between one of said row lines and one of said column lines; and
   an electrical condition supply to be selectively applied to one of said row lines: and
   a feedback control loop to control an electrical condition supplied by said electrical condition supply, the feedback control loop comprises at least one of a latch mechanism between a comparator and said electrical condition supply and a counter to record an output of said comparator.

2. The memory array of claim 1, in which said electrical condition is controlled to cause said memory element to exhibit a target resistance.

3. The memory array of claim 2, in which said target resistance is one of a discrete set of values used to represent digital data.

4. The memory array of claim 1, in which said feedback control loop comprises:
   a sensor connected to one of said column lines connected to said memory element; and
   the comparator with a first input to receive an output signal from said sensor and a second input to receive a reference signal, the output of said comparator connected to said puke driver.

5. The memory array of claim 1, in which said feedback control loop includes a filter mechanism between said sensor and said comparator.

6. The memory array of claim 1, in which said feedback control loop includes an electrical condition limiter.

7. The memory array of claim 1, in which said memory elements are memristive memory elements.

8. A memory array with write feedback, the memory array comprising:
   a number of row lines intersecting a number of column lines;
   memory elements connected between said row lines and said column lines;
   an electrical condition supply to be selectively connected to said row lines;
   a sensor to be selectively connected to said column lines;
   a comparator with a first input to receive an output signal from said sensor and a second input to receive a reference signal, an output of said comparator connected to said electrical condition supply; and
   at least one of a latch mechanism between said comparator and a pulse driver and a counter to record said output of said comparator.

9. The memory array of claim 8, in which said output of said comparator controls said electrical condition supply to cause one of said memory elements to reach a target resistance.

10. The memory array of claim 9, in which said target resistance is one of a discrete set of values used to represent digital data.

11. The memory array of claim 8, further comprising a filter mechanism between said sensor and said comparator.

12. The memory array of claim 8, in which said memory elements are memristive memory elements.

13. A method for setting the state of a memory element within a memory array, the method comprising:
applying an electrical condition to said memory element within said memory array;
sensing a resistive state of said memory element;
controlling said electrical condition based on said sensed resistive state to cause said memory element to reach a target resistance; and
maintaining a logic high signal to said memory element to prevent oscillation.

14. The method of claim 13 further comprising:
recording data corresponding to said resistive state of said memory element by a counter within said memory array.

15. The method of claim 13 further comprising:
filtering a signal associated with said resistive state to said memory element.

* * * * *

UNITED STATES PATENT AND TRADEMARK OFFICE
CERTIFICATE OF CORRECTION

PATENT NO. : 8,331,129 B2
APPLICATION NO. : 12/875423
DATED : December 11, 2012
INVENTOR(S) : Wei Yi et al.

Page 1 of 1

It is certified that error appears in the above-identified patent and that said Letters Patent is hereby corrected as shown below:

In column 8, line 20, in Claim 1, delete "lines:" and insert -- lines; --, therefor.

In column 8, line 40, in Claim 4, delete "puke" and insert -- pulse --, therefor.

Signed and Sealed this
Twelfth Day of March, 2013

Teresa Stanek Rea
*Acting Director of the United States Patent and Trademark Office*